(12) United States Patent
Wicks et al.

(10) Patent No.: US 9,854,707 B2
(45) Date of Patent: Dec. 26, 2017

(54) INTEGRATED PIPE HEAT EXCHANGER

(71) Applicant: Rosemount Aerospace, Inc., Burnsville, MN (US)

(72) Inventors: Curtis Wicks, Shakopee, MN (US); Eric Lovaasen, Chaska, MN (US); Kaleb Anderson, Goodhue, MN (US); Jonathan Boer, Lakeville, MN (US)

(73) Assignee: ROSEMOUNT AEROSPACE INC., Burnsville, MN (US)

( * ) Notice: Subject to any disclaimer, the term of this patent is extended or adjusted under 35 U.S.C. 154(b) by 674 days.

(21) Appl. No.: 14/152,677

(22) Filed: Jan. 10, 2014

(65) Prior Publication Data

US 2015/0201529 A1    Jul. 16, 2015

(51) Int. Cl.
| F28F 7/00 | (2006.01) |
| H05K 7/20 | (2006.01) |
| H01L 23/40 | (2006.01) |
| H01L 23/427 | (2006.01) |
| B23P 15/26 | (2006.01) |
| F28D 15/02 | (2006.01) |
| F28D 21/00 | (2006.01) |

(52) U.S. Cl.
CPC ......... *H05K 7/20418* (2013.01); *B23P 15/26* (2013.01); *F28D 15/0275* (2013.01); *H01L 23/4006* (2013.01); *H01L 23/427* (2013.01); *B23P 2700/10* (2013.01); *F28D 2021/0028* (2013.01); *F28F 2275/08* (2013.01); *F28F 2275/20* (2013.01); *H01L 2924/0002* (2013.01); *Y10T 29/4935* (2015.01)

(58) Field of Classification Search
CPC ............ H05K 7/20418; F28D 15/0275; F28D 2021/0028; F28D 2021/0029; H01L 23/427; H01L 23/40; H01L 23/46; H01L 23/473; H01L 23/467
See application file for complete search history.

(56) References Cited

U.S. PATENT DOCUMENTS

| 5,886,408 A | 3/1999 | Ohki et al. |
| 6,352,103 B1 | 3/2002 | Chu et al. |
| 7,339,787 B2 * | 3/2008 | Cheng .................... G06F 1/203 165/104.26 |

(Continued)

OTHER PUBLICATIONS

Extended European Search Report dated Jun. 12, 2015 in European Application No. 15150254.9.

*Primary Examiner* — Len Tran
*Assistant Examiner* — Jon T Schermerhorn
(74) *Attorney, Agent, or Firm* — Snell & Wilmer L.L.P.

(57) ABSTRACT

A heat exchanger system may have a base, a mounting apparatus for attaching the base to a device, a gasket shelf for placing a gasket, a dissipation member for dissipating heat, and heat generator attachment sites for absorbing heat. A mounting apparatus may have finger-like extensions which flex and draw the base into contact with an underlying electronic device from which the system conducts heat. A base may also have an integrated heat pipe clamp attachment forming an aperture in the base into which a heat pipe may extend and may be clamped in thermal communication. The dissipation device may be a series of fins and troughs and a fan may direct air over the dissipation device to cool the apparatus.

11 Claims, 7 Drawing Sheets

(56) References Cited

U.S. PATENT DOCUMENTS

| | | | | |
|---|---|---|---|---|
| 7,672,123 B2* | 3/2010 | Tatsukami | .............. | G06F 1/203 |
| | | | | 361/679.46 |
| 2012/0160456 A1* | 6/2012 | Aoki | ......................... | G06F 1/20 |
| | | | | 165/104.26 |
| 2013/0068424 A1* | 3/2013 | Hwang | .................... | F28F 3/02 |
| | | | | 165/104.19 |
| 2013/0258585 A1* | 10/2013 | Tanner | .................... | F28F 1/40 |
| | | | | 361/679.52 |
| 2013/0329368 A1* | 12/2013 | Degner | .................... | G06F 1/20 |
| | | | | 361/707 |

* cited by examiner

INTEGRATED PIPE HEAT EXCHANGER

FIELD

The present disclosure relates to heat exchanger systems, and more specifically, to heat exchanger systems that may interface with more than one heat source.

BACKGROUND

Many electronic devices produce significant heat, but design considerations typically only allow a small area of the device to be available for heat dissipation components. HI-eat exchangers are usually employed to dissipate heat; however, a typical heat exchanger uses semi-permanent/permanent methods such as soldering, crimping, or brazing to attach a heat pipe to the heat exchanger. Moreover, typical heat exchangers are limited in the number of heat sources with which they can interface, particularly in light of the small area often available for the heat exchanger.

SUMMARY

In various embodiments, a heat exchanger system may comprise a base having a mounting apparatus configured to secure the base in substantially fixed position with respect to a first heat source, a gasket shelf surrounding the perimeter of the base and adapted to receive a gasket, a first heat generator attachment site formed in the base and configured to be positioned in thermal communication with a first heat source and conduct heat to the base, and a dissipation member configured to conduct heat away from the base.

In various embodiments, a heat exchanger system may have a base having a mounting apparatus configured to secure the base in substantially fixed position with respect to a first heat source, a gasket shelf surrounding the perimeter of the base and adapted to receive a gasket, a first heat generator attachment site formed in the base and configured to be positioned in thermal communication with a first heat source and conduct heat to the base, a dissipation member configured to conduct heat away from the base, a second heat generator attachment site formed in the base and configured to be positioned in thermal communication with a second heat source and conduct heat to the base, and a third heat generator attachment site formed in the base and configured to be positioned in thermal communication with a third heat source and conduct heat to the base, wherein the first heat generator attachment site comprises an integrated heat pipe clamp attachment, wherein the second heat generator attachment site comprises a bolt-on heat pipe attachment, and wherein the third heat generator attachment site comprises a pressure mount attachment site.

In various embodiments, a method of provisioning a heat source with a cooling system may comprise securing a base of the cooling system in substantially fixed position with respect to a first heat source via a mounting apparatus, installing a gasket on a gasket shelf surrounding the perimeter of the base and adapted to receive a gasket, positioning a first heat generator attachment site formed in the base in thermal communication with a first heat source, conducting heat from the first heat source to the base, and conducting heat from the base to a dissipation member configured to conduct heat away from the base.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the inventions, it should be understood that other embodiments may be realized and that logical, chemical and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented.

Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

As used herein, phrases such as "make contact with," "coupled to," "touch," "interface with" and "engage" may be used interchangeably.

In various embodiments, the present disclosure provides a heat exchanger system with improved heat transfer and an ability to dissipate heat from multiple sources with a reduced footprint. In this regard, a single heat exchange system may accept heat originating from multiple sources throughout a device. In various embodiments, this functionality beneficially decreases the footprint occupied by heat exchanger hardware.

In various embodiments, a heat exchanger system may comprise a base, a mounting apparatus, a dissipation member, and a heat generator attachment site. A heat exchanger system may further comprise a gasket shelf.

Figure 1:
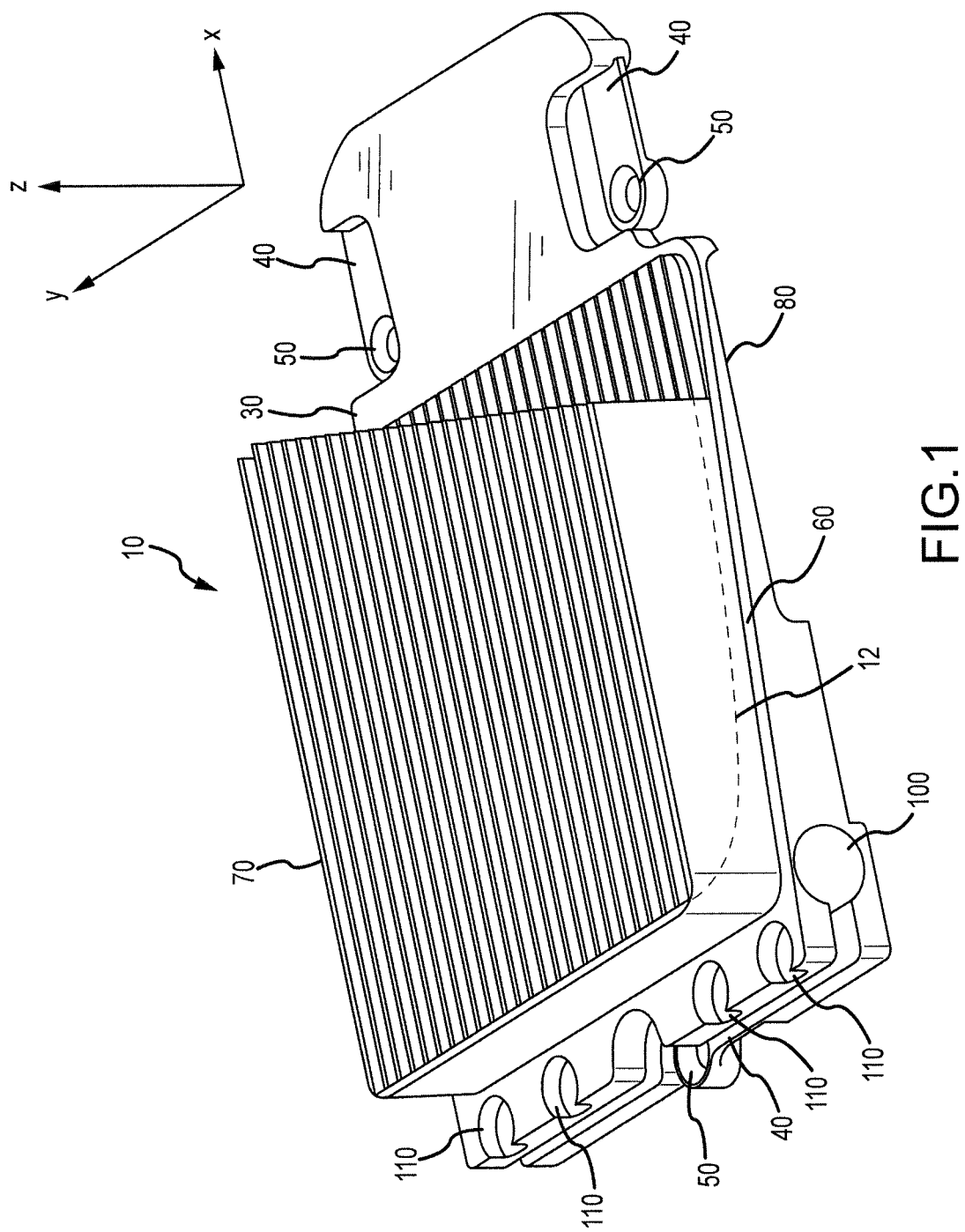
FIG. 1 illustrates a heat exchanger having an integrated heat pipe attachment and integrated spring mount in accordance with various embodiments.
Figure 3:
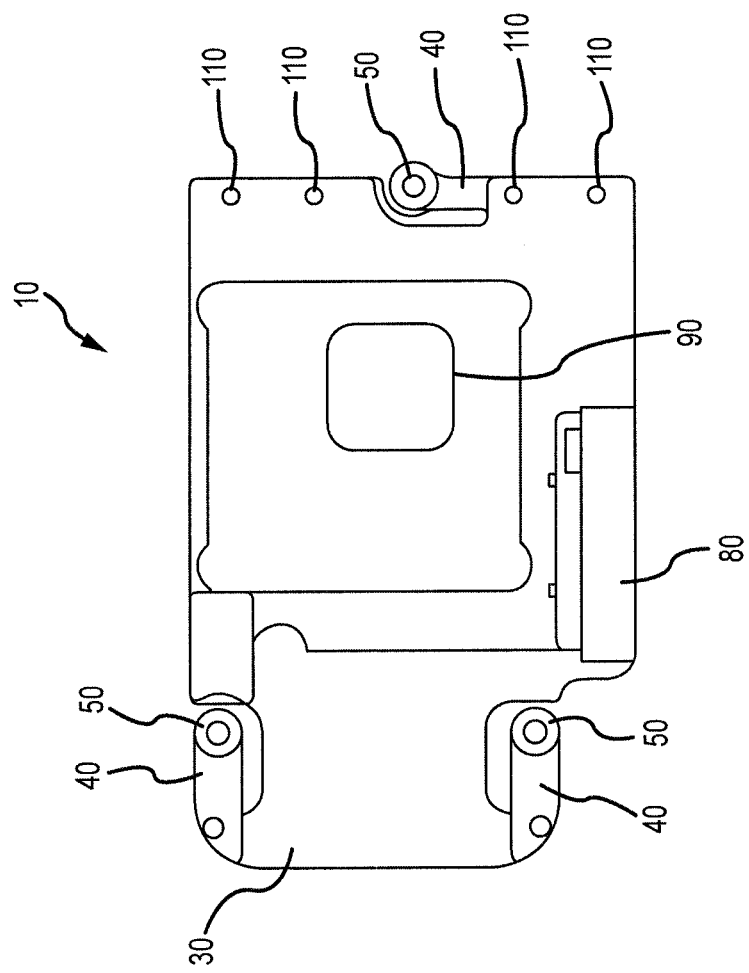
FIG. 3 illustrates a bottom view of a heat exchanger having an integrated heat pipe attachment and integrated spring mount in accordance with various embodiments.

For example, with reference to FIG. 1, in various embodiments, a heat exchanger system 10 may comprise a base 30, integrated spring mount 40, a gasket shelf 60, a dissipation member 70, and heat generator attachment sites, for example, a bolt-on heat pipe attachment 80 and an integrated heat pipe clamp attachment 100. In various embodiments, integrated spring mount 40 may comprise any suitable mounting apparatus. However, a heat exchanger system may comprise any number or configuration of heat generator attachment sites. For example, with reference to FIG. 3, a heat exchanger system 10 may also comprise a pressure mount attachment site 90.

Figure 4:
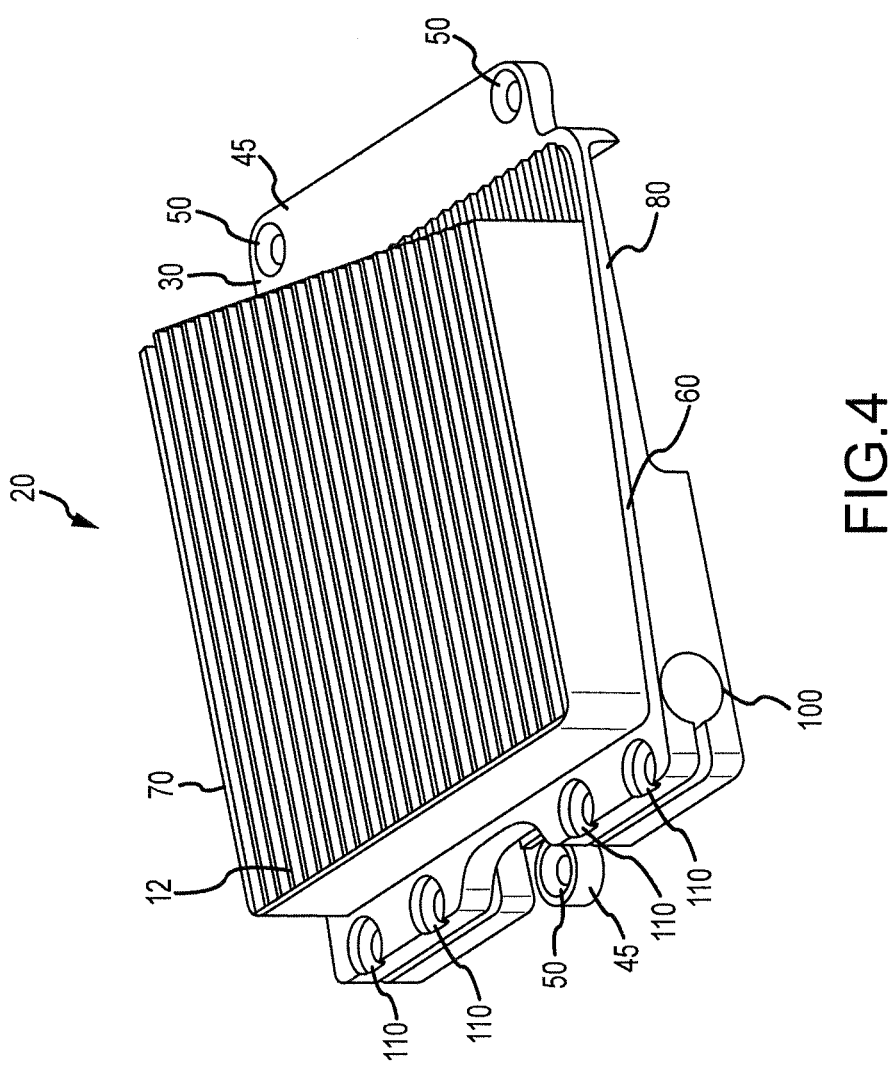
FIG. 4 illustrates a heat exchanger having an integrated heat pipe attachment and integrated spring mount in accordance with various embodiments.

Moreover, with reference to FIG. 4, aspects of various other embodiments are disclosed wherein these embodiments share many of the features discussed with respect to various embodiments according to FIG. 1 and wherein these embodiments may comprise a different number and configuration of heat generator attachment sites. In various embodiments, a heat exchanger system 20 may comprise a base 30, a mounting apparatus comprising a static mount 45, a gasket shelf 60, a dissipation member 70, and heat generator attachment sites, for example, a bolt-on heat pipe attachment 80, and an integrated heat pipe clamp attachment 100. Thus, as illustrated herein, a heat exchanger system may comprise any number or configuration of heat generator attachment sites adapted to accept heat originating from one or more sources throughout a device.

In accordance with various embodiments, a base 30 may comprise a unitary milled block of material. For example, a base 30 may be formed through destructive manufacturing processes performed on a piece of billet metal. For example, a solid block of copper or other material may be milled, machined, or otherwise manufactured whereby it is shaped into base 30. In various embodiments, however, a base 30 may be manufactured through additive manufacturing processes, for example, 3D printing. Moreover, a base 30 may be comprised of copper. In various embodiments a base 30 may be comprised of aluminum, or steel, or any thermally conductive material.

With reference to FIG. 1, in accordance with various embodiments, the system 10 may comprise a mounting apparatus comprising an integrated spring mount 40. For example, base 30 may incorporate one or more integrated spring mounts 40 wherein the integrated spring mounts 40 can be attached to an electronic device via one or more fastening apparatus 50. Fastening apparatus 50 may comprise an aperture. In various embodiments, fastening apparatus 50 may comprise a fastener, a threaded hole, a captive bolt, a captive nut and/or any other apparatus or combination of apparatuses suitable for holding, maintaining, or otherwise coupling, or retaining the base 30 in thermal communication with an underlying device. The underlying device may comprise a first heat source. In various embodiments, the underlying device may comprise a processor, or SOIC, ASIC, or IC, or transistor, or any device requiring heat exchange.

In various embodiments, integrated spring mount 40 comprises a finger-like extension which may flex and draw the base 30 into contact with the underlying device, thereby maintaining a contact force upon the underlying device. In various embodiments, a base 30 may have three integrated spring mounts 40, for example, one centered along the one side of the base 30, for example, a side parallel to the Y-axis and perpendicular to the X-axis, crossing the negative X-axis. For further example, two integrated spring mounts 40 may then be located along another side of the base 30, for example, a side parallel to the Y-axis and perpendicular to the X-axis, crossing the positive X-axis, wherein one integrated spring mount 40 is positioned at each end of the side, for instance, +Y end of the side and at the −Y end of the side, with reference to a coordinate system originating from a point at the center of the base 30.

With reference to FIG. 4, in various embodiments, the system 20 may comprise a mounting apparatus comprising a static mount 45. For example, base 30 may incorporate a static mount 45 wherein the static mount 45 can be attached to an electronic device via one or more fastening apparatus 50. In various embodiments, a base may have two static mounts 45. For example, a first static mount 45 may be centered along the one side of the base, for example, a side parallel to the Y-axis and perpendicular to the X-axis, crossing the negative X-axis, wherein this static mount 45 has one fastening apparatus 50. For further example, a second static mount 45 may also extend along another side of the base, for example, the length of a side parallel to the Y-axis and perpendicular to the X-axis, crossing the positive X-axis, wherein one fastening apparatus 50 is positioned at each end of the length, for instance, +Y end of the side and at the −Y end of the side, with reference to a coordinate system originating from a point at the center of the base 30.

In various embodiments, a heat generator attachment site may be an integrated heat pipe clamp attachment 100. For example, with reference to FIGS. 1, 2, 4, 5, and 7, in various embodiments, a heat pipe clamp attachment 100 may comprise a cylindrical aperture in base 30. The aperture may traverse the entire length of a side of the base 30, or a portion of the length of a side of the base 30. In various embodiments, the aperture may traverse the entire length of a side of the base 30 wherein the aperture traverses a side parallel to the Y axis, and extends through the entire body of the base 30 from the negative most point the base occupies along the X axis, to the positive most point the base occupies along the X axis. In various embodiments, the aperture may lie parallel to the Y-axis, and may extend into the body of base 30. In various embodiments, the aperture may penetrate in any depth and any direction suited to retain a heat pipe in thermal conduction with base 30. In various embodiments, the aperture may extend from the edge of the base 30 crossing the negative X-axis to the edge of the base 30 crossing the positive X-axis. Moreover, the aperture may be trapezoidal, square, rectangular, or any shape adapted to interface in mechanical and thermal communication with a heat pipe. The aperture may have any depth or shape adapted to interface in mechanical and thermal communication with a heat pipe.

Figure 6:
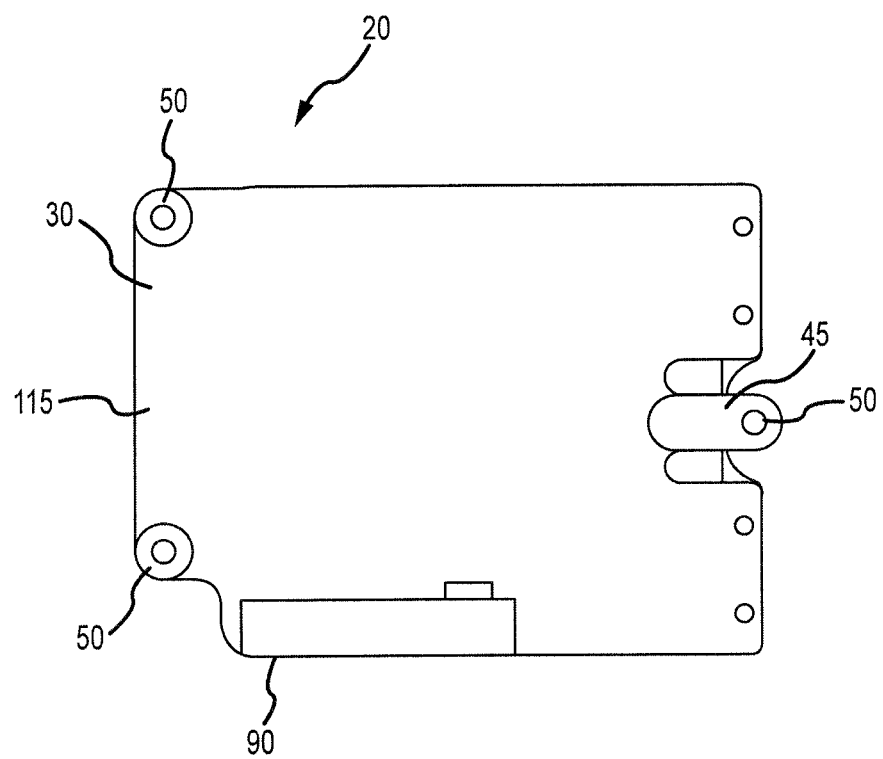
FIG. 6 illustrates a bottom view of a heat exchanger having an integrated heat pipe attachment in accordance with various embodiments.
Figure 7:
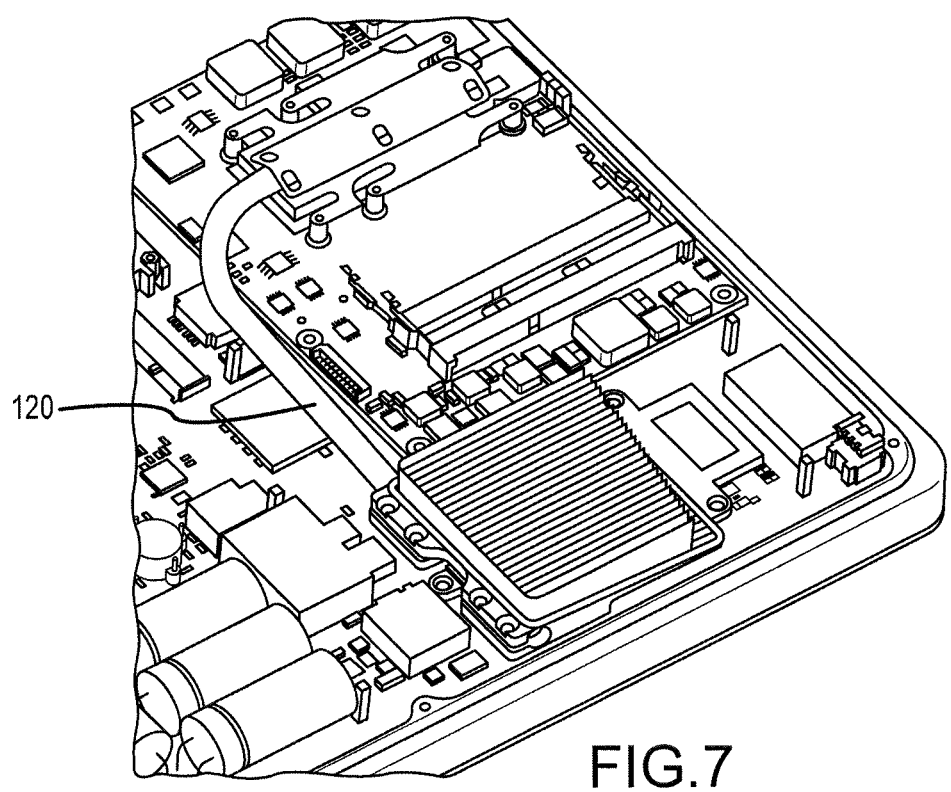
FIG. 7 illustrates a heat exchanger installed in an electronic device in accordance with various embodiments.

With reference to FIGS. 1, 4, and 6, a groove may traverse the length of the aperture, traversing parallel to the aperture which in various embodiments parallels the Y-axis, whereby one or more fastening apparatus 110 may permit fasteners to compress the integrated heat pipe clamp attachment 100 thereby retaining a heat pipe 120 in mechanical and thermal communication with the base 30. As used herein, thermal communication means capability for any form of heat transfer, such as conduction, convection, and radiation, whether directly, or through another body. In various embodiments, fastening apparatus 110 may comprise an aperture and a threaded hole. In various embodiments, fastening apparatus 110 may comprise a fastener, or a captive bolt, or a captive nut or any other apparatus or combination of apparatuses suitable for holding, maintaining, or otherwise coupling, or retaining a heat pipe 120 in mechanical and thermal communication with the base 30.

In various embodiments, a heat generator attachment site may be a bolt-on heat pipe attachment 80. For example, with reference to FIGS. 1-3 and 4-6, and with particular reference to FIGS. 2 and 5, an aperture may be formed in the base 30 wherein a heat pipe may be placed and attached via one or more fastening apparatus 50 (see FIGS. 2 and 5).

In various embodiments, a heat generator attachment site may be a pressure mount attachment site 90. For example, with reference to FIG. 3, a pressure mount attachment site 90 may be formed in the underside of the base 30. In various embodiments, a pressure mount attachment site 90 comprises a flat recessed region suitable for contacting an electronic device, for example, a processor, or a SOIC, or ASIC, or an IC, or a transistor, or any device that requires heat exchange. In this regard, with additional reference to FIG. 1, integrated spring mounts 40 may provide a mating force whereby base 30 is held in mechanical and thermal communication with the processor, or SOIC, ASIC, or IC, or transistor, or any device requiring heat exchange.

Figure 5:
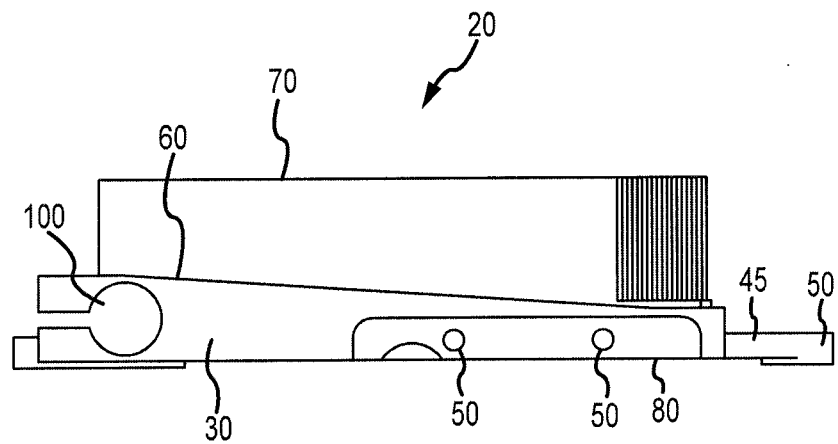
FIG. 5 illustrates a side view of a heat exchanger having an integrated heat pipe attachment in accordance with various embodiments.

In various embodiments, a heat exchanger system may comprise multiple heat generator attachment sites. For example, with reference to FIGS. 1-3, a heat exchanger system 10 may comprise a bolt-on heat pipe attachment 80, an integrated heat pipe clamp attachment 100, and a pressure mount attachment site 90. With reference to FIGS. 4-6, a heat exchanger system 20 may comprise a bolt-on heat pipe attachment 80 and an integrated heat pipe clamp attachment 100. However, a heat exchanger system may comprise any number, arrangement, or selection of heat generator attachment sites.

Figure 2:
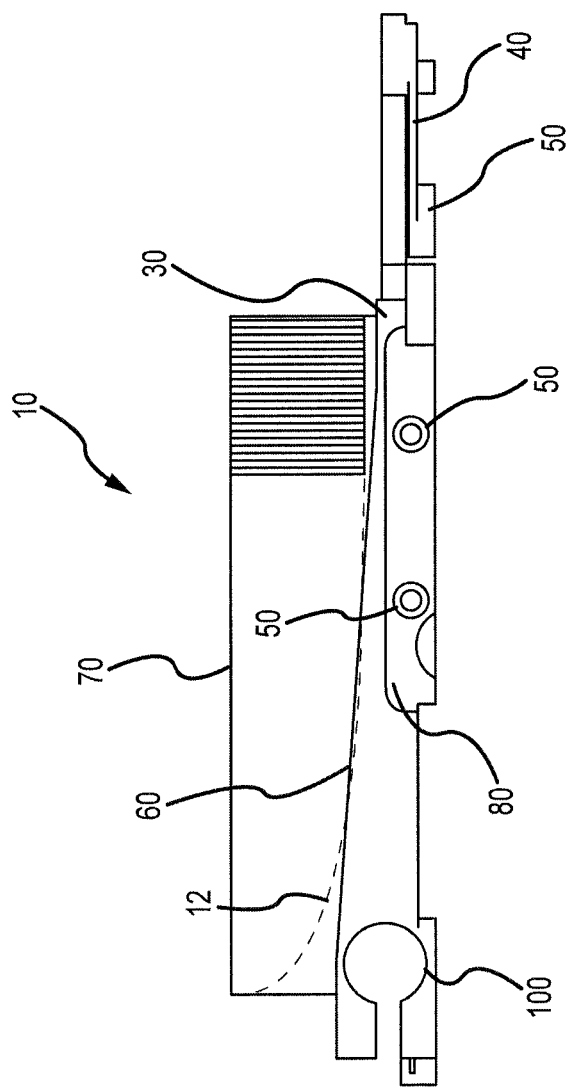
FIG. 2 illustrates a side view of a heat exchanger having an integrated heat pipe attachment and integrated spring mount in accordance with various embodiments.

In various embodiments, a dissipation member 70 may be a set of fins and troughs, for example, for air cooling. With reference to FIGS. 1 and 4, a set of fins may extend upward in the direction of the positive Z-axis from base 30. With reference to FIGS. 2 and 5, a set of fins may terminate in a plane substantially parallel to a plane defined by the bottom face of base 30. A set of troughs may alternate between the fins. The dissipation member 70 may join base 30 according to a curve, for example, to make room for integrated heat pipe clamp attachment 100, yet provide sufficient material to conduct heat away from integrated heat pipe clamp attachment 100. For example, with reference to FIGS. 1 and 4, line 12 may define the curve, for example, line 12, along which dissipation member 70 and base 30 interface. In this regard, the troughs may extend no deeper than line 12. Thus, base 30 may comprise sufficient material in proximity to integrated heat pipe clamp attachment 100 to conduct sufficient heat away from integrated heat pipe clamp attachment 100 and into dissipation member 70. In various embodiments, dissipation member 70 and base 30 comprise a unitary piece of material.

In various embodiments, the troughs may be oriented perpendicular to an integrated heat pipe clamp attachment 100, and wherein the troughs comprise a radiused end whereby the profile of the troughs is shallower near to the integrated heat pipe clamp attachment 100 and deeper extending away from the integrated heat pipe clamp attachment 100.

In various embodiments, a gasket shelf 60 may surround the perimeter of base 30. For example, with reference to FIGS. 1 and 4, a gasket shelf 60 may surround the perimeter of base 30. The gasket shelf 60 follows an angle whereby the gasket shelf 60 lies above the integrated heat pipe clamp attachment 100 (in the positive Z direction), yet declines in a negative Z direction as it extends about the parameter of base 30 in the positive X direction. In this manner, the exposure of dissipation member 70 above gasket shelf 60 may be maximized, without causing integrated heat pipe clamp attachment 100 to be exposed above the gasket shelf 60. However, any shape or configuration of gasket shelf 60 may be implemented wherein a gasket may be placed on the gasket shelf 60 to seal the dissipation member 70 and fan 130 (see FIG. 8) from various surrounding hardware.

Figure 8:
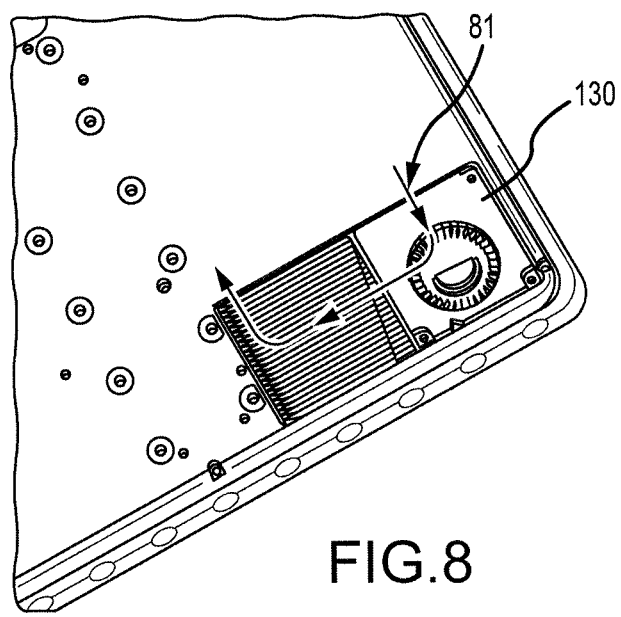
FIG. 8 illustrates a heat exchanger and a cooling fan installed in an electronic device in accordance with various embodiments.
Figure 9:
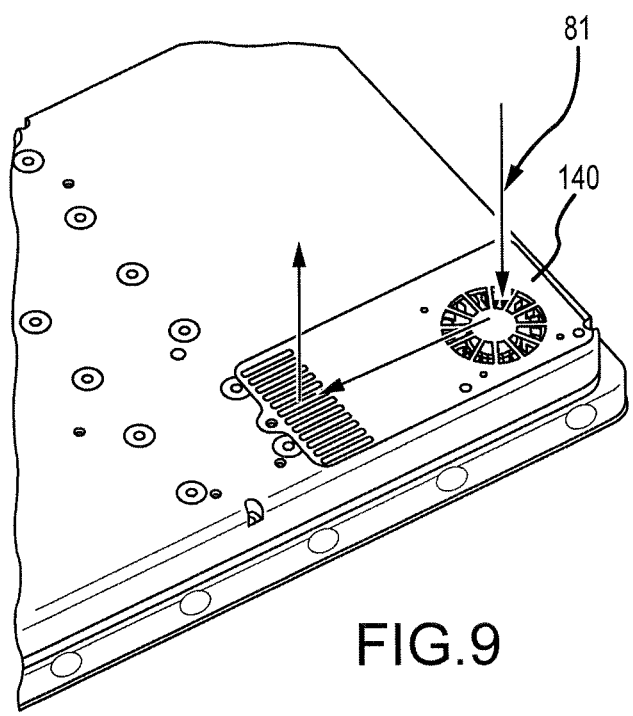
FIG. 9 illustrates a heat exchanger and a cover installed in an electronic device in accordance with various embodiments.

With reference to FIG. 8, in various embodiments, a heat exchanger system may also comprise a fan 130. In various embodiments, fan 130 may intake air and blow the air across the dissipation member 70 of a heat exchanger system. With reference to FIGS. 8 and 9, this air may travel into and out of the system according to direction of airflow 81. In various embodiments, the direction of airflow 81 comprises parallel paths lying normal to the surface of the device in which the system is installed (e.g., normal to the plane of cover 140). In various embodiments, dissipation member 70 comprises fins and troughs, the troughs having a radius, for example, according to line 12. In this regard, the air travels down the troughs of the dissipation member 70, and conveys heat away from the heat exchanger. In various embodiments, the radius redirects the air to exit along a path substantially parallel to the path along which the air entered the fan, for example along a path normal to the plane of the outer face of fan 130, for example, according to direction of airflow 81. In this manner, the air may enter and exit the heat exchanger system through the same side of the system. As a result, various benefits may be realized, for example, only one side of the system is utilized for entry/exit of cooling air, airflow through the heat exchanger may be improved and noise may be ameliorated, for example, as a result of the radiusing of the troughs, external transmission of noise may be ameliorated, and various other benefits. With reference to FIG. 9, in various embodiments, a heat exchanger system may further comprise a cover 140. In various embodiments, cover 140 comprises apertures through which air may flow.

Now, having described various components of heat exchanger systems, a heat exchanger system may be manufactured by various methods. For example, with reference to FIGS. 1 and 4, a dissipation member 70 comprising a set of fins and troughs may be manufactured by a ganged slot cutter tool. In various embodiments, a series of slot cutters are ganged together to create a ganged slot cutter tool, for example, to create all the fins and troughs in a single pass. In various embodiments, a series of slot cutters are shaped to cut troughs having a radius. However, any tool or process may be implemented whereby the fins and toughs are created in a single pass and the troughs are created having a radius, for example, according to line 12.

Gasket shelf 60 may be manufactured by a cutting tool traversing an inclined tool path. For example, a cutting tool may transit the perimeter of base 30 creating an inclined gasket shelf. In this regard, the gasket shelf may follow an angle whereby the gasket shelf 60 lies above the integrated heat pipe clamp attachment 100 in the positive Z direction, yet declines in a negative Z direction as it extends in the positive X direction so as to lie beneath the dissipation member 70 at fan 130.

Now, having described various components of heat exchanger systems, a heat exchanger system may be manufactured from various materials. In various embodiments, a heat exchanger system may comprise copper. However, in further embodiments, a heat exchanger system may comprise other metals, such as aluminum, titanium, tungsten, carbon steel, or stainless steel, though it may further comprise numerous other materials configured to provide thermal conductivity. In various embodiments, various portions of heat exchanger systems as disclosed herein are made of different materials or combinations of materials, and/or may comprise coatings.

In various embodiments, heat exchanger systems may comprise multiple materials, or any material configuration suitable to enhance or reinforce the resiliency and/or support of the system when subjected to wear in an operating environment or to satisfy other desired electromagnetic, chemical, physical, or biological properties such as heat capacity, thermal dissipation, and footprint constraints, among others.

In various embodiments, the present disclosure provides a heat exchanger system with improved heat transfer and an ability to dissipate heat from multiple sources with a reduced footprint. Moreover, the heat exchanger system provides for airflow input and airflow output across a single plane.

In various embodiments, while the heat exchanger systems described herein have been described in the context of electronic device applications, one will appreciate in light of the present disclosure, that the heat exchanger systems described herein may be used on various other applications such as, for example, air conditioning systems, heating systems, and industrial systems or processes. Moreover, the heat exchanger systems described herein may be employed with any heat source in any installation. In various embodiments, the heat exchanger systems described herein are used in the context of a cockpit device for use in an aircraft. Thus, in various embodiments, the heat exchanger systems described herein provide a cost effective and compact heat exchange system.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A heat exchanger system comprising: a base having a mounting apparatus configured to secure the base in a substantially fixed position with respect to a first heat source; a first heat generator attachment site formed in the base and conducts heat to the base, the first heat generator attachment site configured to be positioned in thermal communication with a first heat source; a dissipation member configured to conduct heat away from the base; a second heat generator attachment site formed in the base and configured to be positioned in thermal communication with a second heat source and conduct heat to the base, a third heat generator attachment site formed in the base and configured to be positioned in thermal communication with a third heat source and conduct heat to the base, wherein the first heat generator attachment site comprises an integrated heat pipe clamp attachment, the second heat generator attachment site comprises a bolt-on heat pipe attachment, the third heat generator member comprises fins and troughs, wherein each of the troughs is oriented perpendicular to the first heat generator attachment site, and wherein each of the troughs comprises a radiused end whereby the profile of each trough is shallower near the integrated heat pipe clamp attachment and deeper extending away from the integrated heat pipe clamp attachment; and wherein the heat exchanger system is a unitary piece of material.

2. The system of claim 1, wherein the mounting apparatus comprises a static mount.

3. The system of claim 1, wherein the mounting apparatus comprises an integrated spring mount.

4. The system of claim 1, further comprising a gasket shelf surrounding the perimeter of the base and adapted to receive a gasket.

5. The system of claim 1, further provided with a fan installed to direct airflow over the dissipation member.

6. The system of claim 1, further comprising a fastening apparatus, comprising an aperture disposed in the base, configured to permit fasteners to compress the integrated heat pipe clamp attachment to retain a heat pipe in mechanical and thermal communication with the base.

7. The system of claim 1, wherein the base is formed by milling.

8. A method of provisioning a heat source with a cooling system, the cooling system comprising: a base having a mounting apparatus; a first heat generator attachment site formed in the base; a second heat generator attachment site formed in the base; a third heat generator attachment site formed in the base; a dissipation member; wherein the first heat generator attachment site comprises an integrated heat pipe clamp attachment, the second heat generator attachment site comprises a bolt-on heat pipe attachment, and the third heat generator attachment site comprises a pressure mount attachment; wherein the dissipation member comprises fins and troughs, wherein each of the troughs is oriented perpendicular to the first heat generator attachment site, and wherein each of the troughs comprises a radiused end whereby the profile of each trough is shallower near the integrated heat pipe clamp attachment and deeper extending away from the integrated heat pipe clamp attachment; and wherein the cooling system is a unitary piece of material; the method comprising: securing the base of the cooling system in a substantially fixed position with respect to a first heat source via the mounting apparatus; positioning the first heat generator attachment site formed in the base in thermal communication with the first heat source; positioning the second heat generator attachment site formed in the base in thermal communication with a second heat source; positioning the third heat generator attachment site formed in the base in thermal communication with a third heat source; conducting heat from the first heat source to the base; conducting heat from the second heat source to the base; conducting heat from the third heat source to the base; and conducting heat from the base to the dissipation member.

9. The method of claim 8, further comprising: installing a gasket on a gasket shelf surrounding the perimeter of the base and adapted to receive the gasket; and wherein the dissipation member is formed by cutting fins and troughs into the unitary piece of material.

10. The method of claim 8, further comprising directing airflow over the dissipation member to conduct heat away from the dissipation member.

11. The method of claim 10, wherein the directing comprises directing the airflow to exit the cooling system and to enter the cooling system on substantially parallel paths substantially normal to a plane.

\* \* \* \* \*

UNITED STATES PATENT AND TRADEMARK OFFICE
CERTIFICATE OF CORRECTION

PATENT NO.        : 9,854,707 B2
APPLICATION NO.   : 14/152677
DATED             : December 26, 2017
INVENTOR(S)       : Curtis Wicks et al.

It is certified that error appears in the above-identified patent and that said Letters Patent is hereby corrected as shown below:

In the Claims

On Column 8, Line 36 delete "third heat generator" and please insert therefore -- third heat generator attachment site comprises a pressure mount attachment; wherein the dissipation --

Signed and Sealed this
Tenth Day of July, 2018

Andrei Iancu
*Director of the United States Patent and Trademark Office*